(12) United States Patent
Ma

(10) Patent No.: US 8,929,506 B2
(45) Date of Patent: Jan. 6, 2015

(54) SHIFT REGISTER, DRIVING CIRCUIT, AND DISPLAY APPARATUS

(71) Applicant: BOE Technology Group Co., Ltd., Beijing (CN)

(72) Inventor: Zhanjie Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/993,673

(22) PCT Filed: Nov. 19, 2012

(86) PCT No.: PCT/CN2012/084836
§ 371 (c)(1),
(2) Date: Jun. 12, 2013

(87) PCT Pub. No.: WO2013/143303
PCT Pub. Date: Oct. 3, 2013

(65) Prior Publication Data
US 2014/0064436 A1    Mar. 6, 2014

(30) Foreign Application Priority Data
Mar. 29, 2012  (CN) .......................... 2012 1 0089651

(51) Int. Cl.
*G11C 19/00* (2006.01)
*G11C 19/28* (2006.01)
(52) U.S. Cl.
CPC ...................................... *G11C 19/28* (2013.01)
USPC .................... 377/64; 377/68; 377/78; 377/79
(58) Field of Classification Search
None
See application file for complete search history.

(56) References Cited

U.S. PATENT DOCUMENTS

| 7,420,536 B2 * | 9/2008 | Jang et al. ...................... 345/100 |
| 7,529,334 B2 * | 5/2009 | Jang ................................. 377/64 |

(Continued)

FOREIGN PATENT DOCUMENTS

| CN | 101556833 A | 10/2009 |
| CN | 101625840 A | 1/2010 |

(Continued)

OTHER PUBLICATIONS

English Translation of Chinese Patent Application No. CN101556833, listed above; (67 pages), Oct. 14, 2009.

(Continued)

*Primary Examiner* — Tuan T Lam

(57) ABSTRACT

The present disclosure provides a shift register for delaying and outputting a received startup voltage and meanwhile outputting a voltage inverse to the delayed startup voltage. The shift register including: a voltage shifting module (21) for outputting from the second output terminal a voltage non-inverted to the startup voltage under the control of a second startup voltage signal; a voltage inverting module (22) for outputting from the first output terminal a voltage inverse to the startup voltage under the control of the voltage outputted from the voltage shifting module, and outputting from the first output terminal the voltage non-inverted to the startup voltage under the control of the first startup voltage signal or a third startup voltage signal; a voltage complementing module (23) for outputting from the second output terminal the voltage inverse to the startup voltage under the control of the voltage outputted from the voltage inverting module; and a voltage shifting control module (24) for controlling to turn off the voltage shifting module under the control of the third startup voltage signal. The present disclosure further provides a display apparatus adopting the above shift register and a corresponding method.

9 Claims, 7 Drawing Sheets

(56) References Cited

U.S. PATENT DOCUMENTS

| | | | |
|---|---|---|---|
| 7,760,846 B2* | 7/2010 | Peng et al. | 377/64 |
| 8,155,261 B2* | 4/2012 | Hu | 377/64 |
| 2007/0297559 A1* | 12/2007 | Cho et al. | 377/64 |
| 2008/0056430 A1* | 3/2008 | Chang et al. | 377/64 |
| 2009/0303211 A1 | 12/2009 | Hu | |
| 2011/0142191 A1 | 6/2011 | Tobita | |
| 2014/0064436 A1 | 3/2014 | Ma | |

FOREIGN PATENT DOCUMENTS

| | | |
|---|---|---|
| CN | 202120574 U | 1/2012 |
| CN | 101604551 A | 8/2012 |
| CN | 102651239 A | 8/2012 |
| WO | 2011114563 A1 | 9/2011 |

OTHER PUBLICATIONS

English Translation of Chinese Patent Application No. CN101625840A, listed above; (37 pages), Jan. 13, 2010.

Second Office Action issued by the Chinese Patent Office for Chinese Patent Application No. 2012100896513 issued Mar. 11, 2014, 3pgs.

English translation of Second Office Action issued by the Chinese Patent Office for Chinese Patent Application No. 2012100896513 issued Mar. 11, 2014, 1pg.

English translation of CN101604551A, listed above; 50 pages, Dec. 16, 2009.

English translation of CN101556833A, listed above; 50 pages, Oct. 14, 2009.

English translation of CN101625840A, listed above; 24 pages, Jan. 13, 2010.

English translation of WO2011114563A1, listed above; 26 pages, Sep. 22, 2011.

English translation of CN102651239A, listed above; 64 pages, Aug. 29, 2012.

English translation of CN202120574U, listed above, 13 pages, Jan. 18, 2012.

PCT International Search Report for PCT/CN2012/084836, rendered Nov. 19, 2012.

* cited by examiner

US 8,929,506 B2

SHIFT REGISTER, DRIVING CIRCUIT, AND DISPLAY APPARATUS

This application is based on International Application No. PCT/CN2012/084836 filed on Nov. 19, 2012, which claims priority to Chinese National Application No. 201210089651.3 filed on Mar. 29, 2012, the contents of which are incorporated herein by reference.

TECHNICAL FIELD OF THE DISCLOSURE

The present disclosure relates to the technical field of displaying, and particularly to a shift register, a driving circuit and a display apparatus.

BACKGROUND

The output characteristics of a conventional shift register is related to the polarity of TFTs constituting the shift register, that is, the shift register constituted by N-type TFTs outputs a high voltage Vgh in an operating period, and the shift register constituted by P-type TFTs outputs a low voltage Vgl in the operating period. Existing shift register fails to provide a low voltage output and a high voltage output simultaneously.

In a circuit of a pixel structure of Active Matrix Organic Light-Emitting Diode (AMOLED) having a compensation function, besides that a startup voltage is required to function as it is, another voltage inverse to the startup voltage is also required to function as another startup voltage. The compensated pixel structure constituted by P-type TFTs as shown in FIG. 1 requires five driving signals, wherein DATA (data) signal 11 and VDD (power supply) signal 14 are provided directly by a Source IC (driving circuit board), the other three signals are inputted to the pixel structure through a shift register, wherein the startup voltage for GATE (gate) signal 12 and for RESET (reset) signal 13 is a low voltage and the startup voltage for EMISSION (emission) signal 15 is a high voltage. Therefore, existing shift registers cannot satisfy the requirement of providing the GATE (gate) signal and the RESET (reset) signal as a low voltage and the EMISSION signal as a high voltage at the same time.

SUMMARY

Embodiments of the present disclosure provide a shift register capable of delaying a received startup voltage and outputting the delayed startup voltage and also capable of outputting an inverse voltage inverse to the outputted delayed startup voltage.

In the embodiments of the present disclosure, there is provided a shift register including:

a voltage shifting module, a voltage inverting module, a voltage complementing module, a voltage shifting control module, a first output terminal and a second output terminal;

wherein the voltage shifting module is used for receiving a voltage non-inverted to a startup voltage under the control of a first startup voltage signal and outputting the received voltage non-inverted to the startup voltage from the second output terminal and simultaneously to the voltage inverting module under the control of a second startup voltage signal;

the voltage inverting module is connected to the voltage shifting module and is used for outputting a voltage inverse to the startup voltage from the first output terminal and simultaneously to the voltage complementing module under the control of the received voltage outputted from the voltage shifting module and a voltage supplied from an inverse voltage source; and outputting a voltage non-inverted to the startup voltage from the first output terminal and simultaneously to the voltage complementing module under the control of the first startup voltage signal and a voltage supplied from a startup voltage source or under the control of a third startup voltage signal and the voltage supplied from the startup voltage source;

the voltage complementing module is connected to the voltage inverting module and the voltage shifting module, and is used for outputting the voltage inverse to the startup voltage from the second output terminal and simultaneously to the voltage inverting module under the control of the received voltage outputted from the voltage inverting module and the voltage supplied from the inverse voltage source, when the voltage inverting module outputs the voltage non-inverted to the startup voltage;

the voltage shifting control module is connected to the voltage shifting module, and is used for controlling to turn off the voltage shifting module under the control of the third startup voltage signal and the voltage supplied from the inverse voltage source.

In the embodiments of the present disclosure, there is provided a shifting method of the shift register, the shift register including:

a voltage shifting module, a voltage inverting module, a voltage complementing module, a voltage shifting control module, a first output terminal and a second output terminal; and the method including:

the voltage shifting module receiving a voltage non-inverted to a startup voltage under the control of a first startup voltage and outputting a voltage non-inverted to the startup voltage from the second output terminal under the control of a second startup voltage;

the voltage inverting module outputting a voltage inverse to the startup voltage from the first output terminal under the control of the received voltage outputted from the voltage shifting module; and outputting the voltage non-inverted to the startup voltage from the first output terminal under the control of the first startup voltage and a third startup voltage;

the voltage complementing module outputting the voltage inverse to the startup voltage from the second output terminal under the control of the received voltage outputted from the voltage inverting module, when the voltage inverting module outputs the startup voltage;

the voltage shifting control module controlling to turn off the voltage shifting module under the control of the received third startup voltage, when the voltage inverting module outputs the startup voltage.

In the embodiments of the present disclosure, there is provided a driving circuit including a shift register at a first stage, a shift register at a last stage and at least one shift register at intermediate stages, wherein each of the shift registers is the above described shift register, and the shift registers are connected in cascade, that is, the second output terminal of the shift register at each stage is connected to the voltage shifting module of the shift register at a next stage;

the voltage shifting module of the shift register at the first stage receives the voltage non-inverted to the startup voltage, and outputs the voltage from the second output terminal to the voltage shifting module of the shift register at a next stage; and the shift register at the first stage outputs, from the first output terminal, the voltage inverse to the voltage outputted from the second output terminal;

the voltage shifting module of the shift register at each intermediate stage receives the voltage outputted from the second output terminal of the shift register at a previous stage, and the shift register at each intermediate stage outputs the voltage from the second output terminal thereof to the voltage shifting module of the shift register at a next stage and outputs, from the first output terminal thereof, the voltage inverse to the voltage outputted from the second output terminal thereof;

the voltage shifting module of the shift register at the last stage receives the voltage outputted from the second output terminal of the shift register at a previous stage and outputs, from the first output terminal thereof, the voltage inverse to the voltage outputted from the second output terminal thereof; and after the first startup voltage signal for controlling the shift register at the current stage is off, the first startup voltage signal for controlling the shift register at the next stage is on.

In the embodiments of the present disclosure, there is provided a display apparatus including the above described driving circuit.

The shift register according to the embodiments of the present disclosure provides a startup voltage to the shift register at a next stage and meanwhile outputs a voltage inverse to the startup voltage, so that the shift register not only provides a delayed voltage non-inverted startup voltage to the shift register at the next stage, but also provides an inverse voltage inverse to the delayed startup voltage.

DETAILED DESCRIPTION

In order to make a shift register capable of outputting a voltage signal obtained by delaying a received voltage signal and meanwhile outputting a voltage signal inverse to the delayed voltage signal, embodiments of the present disclosure provide a shift register with an inverse output.

Descriptions will be made for the embodiments of the present disclosure below, taken in conjunction with the accompanying drawings.

Figure 1:
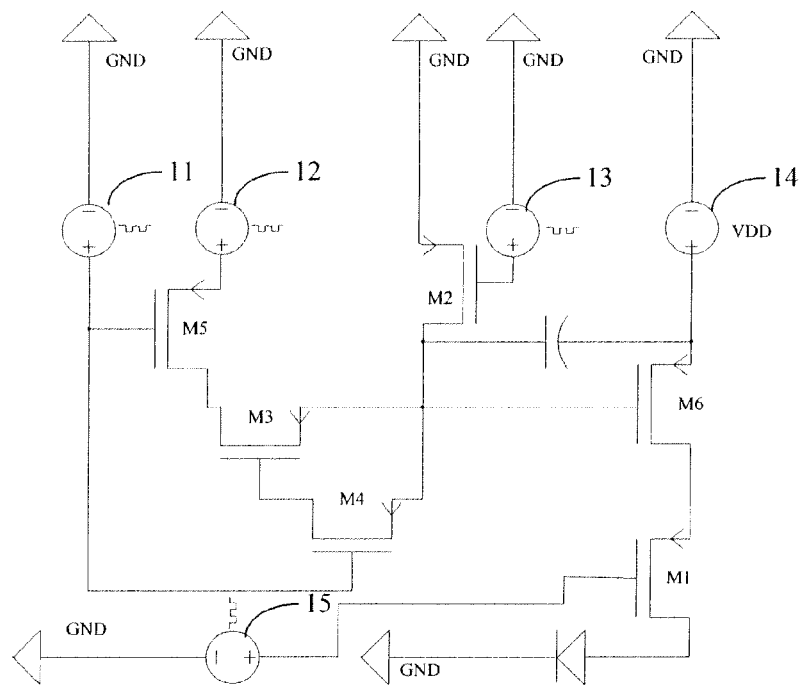
FIG. 1 is a compensated pixel structure constituted by P-type TFTs.
Figure 2:
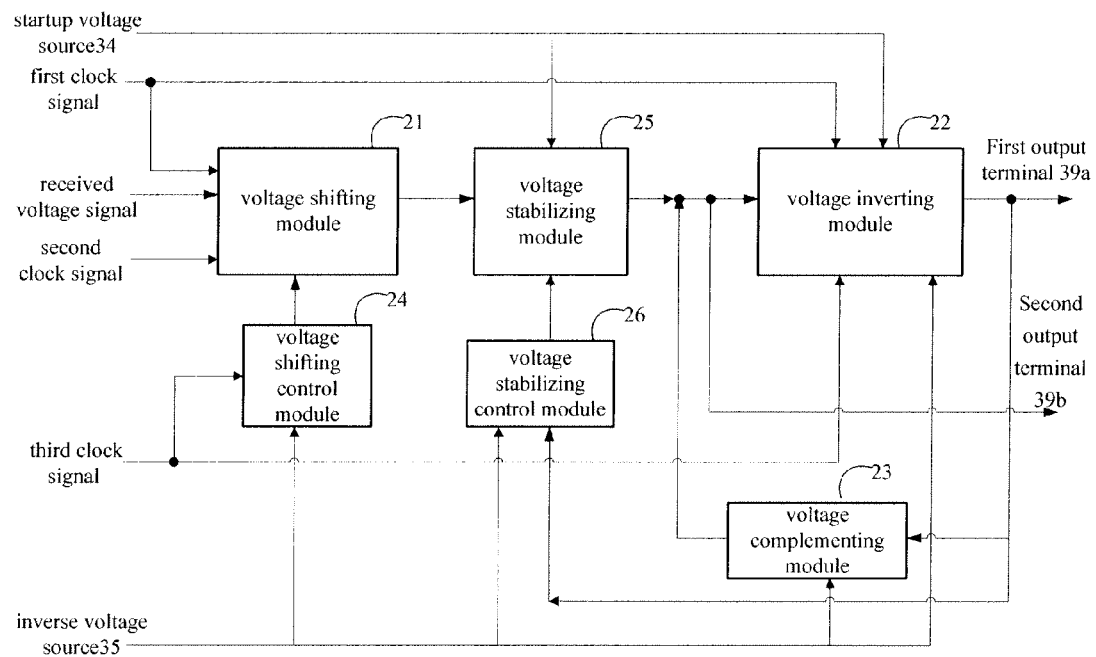
FIG. 2 is a schematic structure diagram according to embodiment 1 of the present disclosure.

Embodiment 1 of the present disclosure is shown in FIG. 2, a shift register with an inverse output includes: a voltage shifting module 21, a voltage inverting module 22, a voltage complementing module 23, a voltage shifting control module 24, a voltage stabilizing module 25, a voltage stabilizing control module 26, a first output terminal 39a and a second output terminal 39b.

A first startup voltage signal, a second startup voltage signal and a third startup voltage signal in the present embodiment are a first clock signal, a second clock signal and a third clock signal, respectively.

The voltage shifting module 21 is used for receiving a voltage signal non-inverted to a startup voltage under the control of the first clock signal and outputting the received voltage signal non-inverted to the startup voltage from the second output terminal and simultaneously outputting to the voltage stabilizing module 25 under the control of the second clock signal.

The voltage signal received by the voltage shifting module 21 may be an external trigger voltage signal; and may also be, when a plurality of shift registers are connected in cascade to constitute a driving circuit, a voltage signal outputted from the shift register at a previous stage. The voltage shifting module 21 can receive the voltage signal under the control of the first clock signal, and it can output the received voltage signal from the second output terminal 39b under the control of the second clock signal.

The voltage stabilizing module 25 is used for outputting from the second output terminal 39b a stable voltage non-inverted to the voltage outputted from the voltage shifting module 21 under the control of the voltage supplied from the startup voltage source. An input terminal of the voltage stabilizing module 25 is connected to an output terminal of the voltage shifting module 21, and an output terminal of the voltage stabilizing module 25 is connected to an input terminal of the voltage inverting module 22. The voltage stabilizing module 25 ensures that the output voltage thereof is a stable voltage non-inverted to the startup voltage. Actually, a stable voltage non-inverted can also be supplied from a voltage source non-inverted to the voltage outputted from the voltage shifting module 21.

The voltage inverting module 22 is connected to the voltage stabilizing module 25 and is used for outputting a voltage signal inverse to the startup voltage from the first output terminal 39a and simultaneously to the voltage complementing module 23 and the voltage stabilizing control module 26 under the control of the received voltage signal outputted from the voltage stabilizing module 25 and the voltage supplied from the startup voltage source 34; and outputting the voltage non-inverted to the startup voltage from the first output terminal 39a and simultaneously to the voltage complementing module 23 and the voltage stabilizing module 26 under the control of the first clock signal and the voltage supplied from the startup voltage source 34 or under the control of the third clock signal and the voltage supplied from the startup voltage source 34.

The voltage inverting module 22 is connected to the voltage stabilizing module 25. The startup voltage outputted from the voltage shifting module 21 is inputted to the voltage stabilizing module 25, and the voltage outputted from the voltage stabilizing module 25 is inputted to the voltage inverting module 22. The voltage inverting module 22 receives the voltage outputted from the voltage stabilizing module 25 non-inverted to the startup voltage and the voltage supplied from the startup voltage source 34, and meanwhile outputs the voltage inverse to the startup voltage; and outputs the voltage non-inverted to the startup voltage from the first output terminal 39a and simultaneously to the voltage complementing module 23 and the voltage stabilizing module 26 under the control of the first clock signal and the voltage supplied from the startup voltage source 34 or under the control of the third clock signal and the voltage supplied from the startup voltage source 34.

Actually, the voltage shifting module 21 and the voltage inverting module 22 can be connected directly. The voltage stabilizing module 25 is inserted between the voltage shifting module 21 and the voltage inverting module 22 to stabilize the voltage outputted from the voltage shifting module 21. However, the functions of the voltage shifting module 21 and the voltage inverting module 22 will not be affected even if the voltage stabilizing module 25 is not present. The voltage shifting module 21 is still capable of shifting the received voltage and then outputting the shifted voltage, and the voltage inverting module 22 is capable of receiving the voltage outputted from the voltage shifting module 21 and outputting an inverted voltage.

The voltage complementing module 23 is connected to the voltage inverting module 22, and is used for outputting the voltage inverse to the startup voltage from the second output terminal and simultaneously to the voltage inverting module 22 when the voltage inverting module outputs the voltage non-inverted to the startup voltage, under the control of the received voltage outputted from the voltage inverting module 22 and the voltage supplied from the inverse voltage source.

The voltage complementing module 23 is controlled by the voltage outputted from the voltage inverting module 22 to output the voltage inverse to the startup voltage from the second output terminal 39b when the voltage shifting module does not output.

The voltage shifting control module 24 is connected to the voltage shifting module 21, and is used for closing the voltage shifting module 21 under the control of the third clock signal and the voltage supplied from the inverse voltage source 35.

The voltage shifting control module 24 is controlled by the third clock signal, and in turn outputs a control voltage to the voltage shifting module 21. Particularly, the voltage shifting control module 24 turn offs the voltage shifting module 21 when the voltage inverting module 22 outputs the voltage non-inverted to the startup voltage.

The voltage stabilizing control module 26 is used for closing the voltage stabilizing module 25 under the control of the received voltage outputted from the first output terminal by the voltage inverting module 22 and the voltage supplied from the inverse voltage source 35, when the voltage inverting module 22 outputs the voltage non-inverted to the startup voltage.

The voltage stabilizing control module 26 is not necessary when the voltage stabilizing module 25 does not exist.

In the present embodiment, the second clock signal is on after the first clock signal is off; the third clock signal is on after the second clock signal is off; the first clock signal is on after the third clock signal is off, and so on.

The voltage shifting module 21 receives the voltage non-inverted to the startup voltage under the control of the first clock signal, and outputs the voltage non-inverted to the startup voltage to the second output terminal 39b under the control of the second clock signal; and does not output any voltage signal under the control of the first clock signal and the third clock signal. The voltage inverting module 22 outputs the voltage non-inverted to the startup voltage from the first output terminal 39a under the control of the first clock signal and the third clock signal; and outputs the voltage inverse to the startup voltage to the first output terminal 39a under the control of the second clock signal. When the first output terminal 39a outputs the voltage inverse to the startup voltage, the voltage outputted from the first output terminal 39a controls the voltage complementing module 23 to output, from the second output terminal 39b, the voltage inverse to the voltage outputted from the first output terminal 39a. To this end, the startup voltage outputted from the second output terminal 39b is delayed in one clock cycle compared to the startup voltage received by the voltage shifting module 21, and the voltage outputted from the first output terminal 39a and the voltage outputted from the second output terminal 39b are inverse to each other. The shift register not only delays the received voltage signal and outputs the delayed voltage signal, but also outputs the voltage signal inverse to the outputted delayed voltage signal.

The shift register in the present embodiment can delay the received voltage signal and output the delayed voltage signal, and meanwhile provide the inverse voltage inverse to the outputted delayed voltage signal.

Embodiment 2

Figure 3:
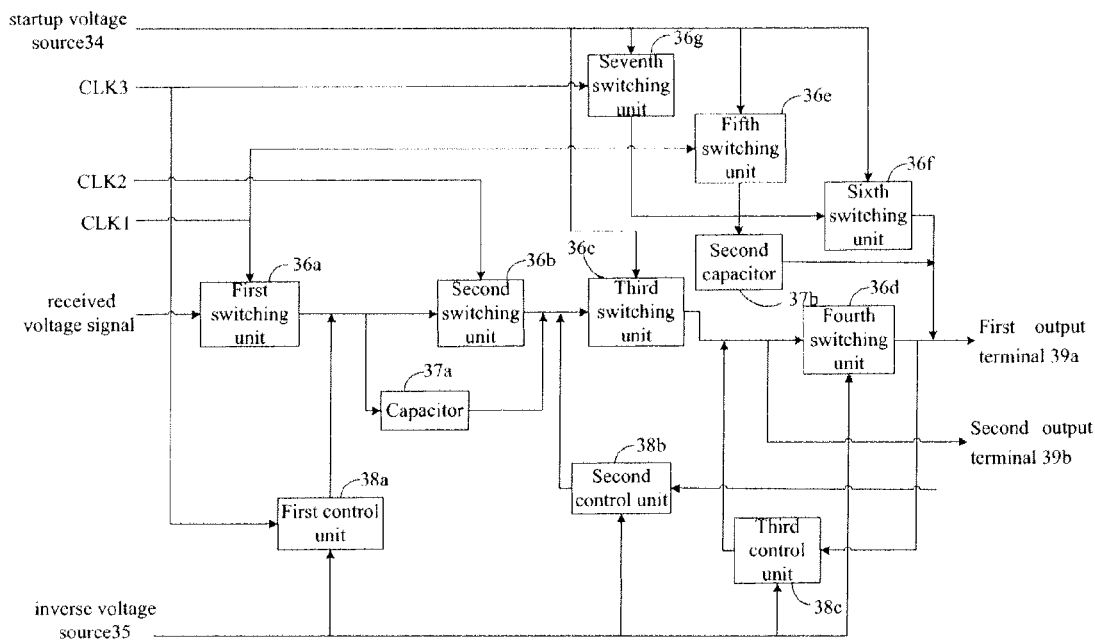
FIG. 3 is a schematic structure diagram of a circuit according to embodiment 2 of the present disclosure.

As shown in FIG. 3, a schematic structure diagram of a particular circuit according to the embodiment of the present disclosure is shown.

In the present embodiment, the startup voltage signals are provided by CLK1, CLK2 and CLK3, and the voltage non-inverted to the startup voltage and the voltage inverse to the startup voltage are provided by the startup voltage source 34 and the inverse voltage source 35, respectively, in each cycle of CLK1, there is a voltage shifting module startup voltage with length of ⅓ cycle; in each cycle of CLK2, there is also a voltage shifting module startup voltage with length of ⅓ cycle, which lags behind the startup voltage of the first clock signal CLK1 ⅓ cycle; in each cycle of CLK3, there is also a voltage shifting module startup voltage with length of ⅓ cycle, which lags behind the startup voltage of the second clock signal CLK2 ⅓ cycle.

The voltage shifting module in the present embodiment includes a first switching unit 36a, a first capacitor 37a and a second switching unit 36b.

The first switching unit 36a performs switching operation under the control of CLK1, and controls to output the received voltage non-inverted to the startup voltage to the first capacitor 37a as a charging voltage and to the second switching unit 36b as a control voltage.

A control terminal of the first switching unit 36a receives CLK1, an input terminal of the first switching unit 36a receives a voltage signal, and an output terminal thereof is connected to a control terminal of the second switching unit 36b. The voltage signal received at the input terminal of the first switching unit 36a may be an external trigger voltage signal, and when a plurality of shift registers are connected in cascade to constitute a driving circuit, the voltage signal received at the input terminal of the first switching unit 36a may also be a voltage signal outputted from the shift register at a previous stage.

The first capacitor 37a receives the voltage non-inverted to the startup voltage when the first switching unit 36a is turned on, and is charged to provide a driving control voltage to the second switching unit 36b.

One terminal of the first capacitor 37a is connected to a control terminal of the second switching unit 36b, and the other terminal of the first capacitor 37a is connected to an output terminal of the second switching unit 36b. The first capacitor 37a is charged when the first switching unit 36a is turned on, and provides a voltage to the second switching unit 36b when the first switching unit 36a is turned off.

The second switching unit 36b performs switching operation so as to control to output CLK2 to a third switching unit 36c as a control voltage under the control of the control voltage outputted from the first switching unit 36a, the driving control voltage provided by the first capacitor 37a or a control voltage outputted from a first control unit 38a.

The control terminal of the second switching unit 36b is connected to the output terminal of the first switching unit 36a, an input terminal of the second switching unit 36b receives CLK2, and an output terminal thereof is connected to a control terminal of the third switching unit 36c.

The voltage inverting module includes: a fourth switching unit 36d, a fifth switching unit 36e, a second capacitor 37b, a sixth switching unit 36f and a seventh switching unit 36g.

The fourth switching unit 36d performs switching operation under the control of the control voltage outputted from the third switching unit 36c, so as to control to output the voltage supplied from the inverse voltage source 35 from the first output terminal 39a; the inverse voltage source 35 supplies a voltage inverse to the shift register startup voltage; the first output terminal 39a can be used as the output terminal of the shift register at the present stage.

A control terminal of the fourth switching unit 36d is connected to the output terminal of the third switching unit 36c, an input terminal of the fourth switching unit 36 receives the voltage supplied from the inverse voltage source 35, and an output terminal of the fourth switching unit 36d is connected to the first output terminal 39a.

The first to fourth switching units are turned on one by one, such that not only the voltage non-inverted to the startup voltage is outputted to the shift register at a next stage as a startup voltage, but also the voltage inverse to the startup voltage is provided for the shift register at the present stage.

The fifth switching unit 36e performs switching operation under the control of CLK1, and outputs the voltage supplied from the startup voltage source 34 to the second capacitor 37b as a charging voltage and to the sixth switching unit 36f as a control voltage.

A control terminal of the fifth switching unit 36e receives CLK1, an input terminal of the fifth switching unit 36e receives the voltage supplied from the startup voltage source 34, and an output terminal of the fifth switching unit 36e is connected to a control terminal of the sixth switching unit 36f.

The second capacitor 37b receives the voltage supplied from the startup voltage source 34 when the fifth switching unit 36e is turned on, and turns off the sixth switching unit 36f when the fourth switching unit 36d is turned on.

One terminal of the second capacitor 37b is connected to the control terminal of the sixth switching unit 36f, and another terminal of the second capacitor 37b is connected to the output terminal of the sixth switching unit 36f.

The sixth switching unit 36f performs switching operation under the control of the control voltage outputted from the fifth switching unit 36e and a control voltage outputted from the seventh switching unit 36g, so as to control to output the voltage supplied from the startup voltage source 34 from the first output terminal 39a.

A control terminal of the sixth switching unit 36f is connected to the output terminal of the fifth switching unit 36e, an input terminal of the sixth switching unit 36f receives the voltage supplied from the startup voltage source 34, and an output terminal of the sixth switching unit 36f is connected to the first output terminal 39a.

The seventh switching unit 36g performs switching operation under the control of CLK3, so as to control to output the voltage supplied from the startup voltage source 34 to the sixth switching unit 36f as the control voltage and to the second capacitor 37b to charge the same.

A control terminal of the seventh switching unit 36g receives CLK3, an input terminal of the seventh switching unit 36g is connected to the startup voltage source 34, and an output terminal of the seventh switching unit 36g is connected to the control terminal of the sixth switching unit 36f.

The voltage complementing module includes a third control unit 38c.

The third control unit 38c performs switching operation under the control of the voltage outputted from the first output terminal 39a, so as to control to output the voltage supplied from the inverse voltage source 35 to the fourth switching unit 36d as a switching-off voltage and output the voltage supplied from the inverse voltage source 35 from the second output terminal 39b.

A control terminal of the third control unit 38c is connected to the first output terminal 39a, an input terminal of the third control unit 38c receives the voltage signal outputted from the inverse voltage source 35, and an output terminal of the third control unit 38c is connected to the control terminal of the fourth switching unit 36d.

The fifth to seventh switching units provide the startup voltage to the first output terminal, so as to control the outputs of the third switching unit, the fourth switching unit and the second output terminal after the second and third control units are turned on.

The voltage shifting control module includes: a first control unit 38a.

The first control unit 38a performs switching operation under the control of CLK3, so as to control the first capacitor 37a to be discharged after being connected to the inverse voltage source 35.

A control terminal of the first control unit 38a receives CLK3, an input terminal of the first control unit 38a is connected to the inverse voltage source 35, and an output terminal of the first control unit 38a is connected to the control terminal of the second switching unit 36b.

The voltage stabilizing module includes the third switching unit 36c.

The third switching unit 36c performs switching operation under the control of the control voltage outputted from the second switching unit 36b or the control voltage outputted from the second control unit 38b, so as to control to output the voltage outputted from the startup voltage source 34 to the fourth switching unit 36d as a control voltage and control to output the voltage outputted from the startup voltage source 34 from the second output terminal 39b. The second output terminal 36b is used for providing a startup voltage for the shift register at the next stage, and the startup voltage source supplies the same voltage as the startup voltage of the shift register.

The control terminal of the third switching unit 36c is connected to the output terminal of the second switching unit 36b, an input terminal of the third switching unit 36c receives the voltage supplied from the startup voltage source 34, and an output terminal of the third switching unit 36c is connected to the control terminal of the fourth switching unit 36d.

The voltage stabilizing control module includes a second control unit 38b.

An output terminal of the second control unit 38b is connected to the control terminal of the third switching unit 36c.

The third switching unit 36c is turned off after the second control unit 38b is turned on.

The second output terminal 39b outputs a voltage signal obtained by delaying the received voltage signal, which can be used, in a driving circuit constituted by a plurality of shift registers, as a signal inputted to the shift register at a next stage. The first output terminal 39a outputs a voltage signal inverse to the voltage signal outputted from the second output terminal 39b, which is supplied to a circuit which needs to be driven by an inverse voltage signal.

Operational timing sequence chart of the present embodiment is as follows:

When CLK1 outputs a voltage non-inverted to the startup voltage, the first switching unit 36a is turned on, and the voltage non-inverted to the startup voltage received by the first switching unit 36a is output to the second switching unit 36b, and is output to the first capacitor 37a to charge the same.

The fifth switching unit 36e is turned on under the control of the voltage non-inverted to the startup voltage outputted from CLK1, the voltage supplied from the startup voltage source 34 is outputted to the sixth switching unit 36f via the fifth switching unit 36e and charge the second capacitor 37b. The sixth switching unit 36f is turned on under the control of the voltage supplied from the startup voltage source 34, and the voltage supplied from the startup voltage source 34 is outputted as the startup voltage from the first output terminal 39a via the sixth switching unit 36f.

The second control unit 38b and the third control unit 38c are turned on under the control of the startup voltage output from the first output terminal 39a, and the inverse voltage source 35 outputs voltage signal to the third switching unit 36c and the fourth switching unit 36d via the second control unit 38b and the third control unit 38c respectively and turns off the third switching unit 36c and the fourth switching unit 36d; at this time, the second output terminal 39b outputs the voltage signal supplied from the inverse voltage source 35.

The voltage outputted from CLK1 is converted to the voltage inverse to the startup voltage, and the first capacitor 37a outputs the voltage stored therein to the second switching unit 36b to turn on the same.

At this time, the voltage non-inverted to the startup voltage outputted from CLK2 is outputted to the third switching unit 36c through the turned-on second switching unit 36b, the third switching unit 36c is turned on under the control of the voltage non-inverted to the startup voltage outputted from CLK2, and the startup voltage source 34 outputs the startup voltage from the second output terminal 39b via the third switching unit 36c and outputs the voltage signal to the fourth switching unit 36d through the third switching unit 36c.

After the fourth switching unit 36d is turned on, the inverse voltage source 35 outputs the voltage signal from the first output terminal 39a through the fourth switching unit 36d.

The second capacitor 37b provides bootstrapping function for the sixth switching unit 36f, so as to turn off the sixth switching unit 36f.

When CLK1 supplies a voltage non-inverted to the startup voltage, the fifth switching unit 36e is turned on and provides the voltage outputted from the startup voltage source 34 to the sixth switching unit 36f. When CLK2 supplies a voltage non-inverted to the startup voltage, the fifth switching unit 36e is turned off. In order to turn off the sixth switching unit 36f when CLK2 supplies the startup voltage, it is necessary to connect both terminals of the capacitor to the control terminal and the output terminal of the sixth switching unit, respectively. It is because when CLK1 supplies the voltage non-inverted to the startup voltage, the voltage non-inverted to the startup voltage is outputted to the control terminal of the sixth switching unit 36f through the turned-on fifth switching unit 36e. When CLK2 supplies the voltage non-inverted to the startup voltage, the fifth switching unit 36e is turned off and the control terminal of the sixth switching unit 36f is floating; at this time, since the voltage outputted from the first output terminal 39a is a voltage inverse to the startup voltage when CLK2 supplies the voltage non-inverted to the startup voltage, the potential difference between the control terminal and the output terminal of the sixth switching unit 36f would turn on the sixth switching unit 36f, such that the voltage non-inverted to the startup voltage is also outputted to the first output terminal 39a, which causes the confusion state of voltage. Therefore, a capacitor is required to control the voltage at the control terminal of the sixth switching unit 36f, so as to make the sixth switching unit 36f be in a switching-off state. Therefore, by adding a second capacitor 37b, the voltage at the control terminal of the sixth switching unit 36f is changed from the voltage supplied from the startup voltage source 34 to the voltage supplied from the inverse voltage source 35 through the bootstrapping function of the second capacitor 37b, such that the sixth switching unit 36f is in the switching-off state until the startup voltage signal in a next clock signal is received.

The voltage inverse to the startup voltage outputted from the first output terminal 39a also turns off the second control unit 38b and the third control unit 38c.

When the voltage signal outputted from CLK2 is the voltage inverse to the startup voltage, CLK3 outputs the voltage non-inverted to the startup voltage to enable the seventh switching unit 36g and the first control unit 38a to be turned on. After the seventh switching unit 36g is turned on, the startup voltage source 34 outputs a voltage signal to the sixth switching unit 36f to enable the sixth switching unit 36f to be turned on. After the sixth switching unit 36f is turned on, the startup voltage source 34 outputs a voltage signal from the first output terminal 39a and outputs the same to the second control unit 38b and the third control unit 38c. After the second control unit 38b and the third control unit 38c are turned on, the inverse voltage source 35 outputs a voltage signal to the third switching unit 36c, the second output terminal 39b and the fourth switching unit 36d. The third switching unit 36c and the fourth switching unit 36d are turned off, and the second output terminal 39b outputs a inverse voltage.

The shift register provided in the present embodiment can output a shifted voltage signal from the second output terminal, and from the first output terminal output a voltage signal inverse to the voltage signal outputted from the second output terminal, and thus can meet the requirement for the voltage signals inverse to each other simultaneously. Therefore, the shift register provided in the present embodiment can not only output the voltage signal obtained by delaying the received startup voltage to the shift register at a next stage, but also output to the shift register at the present stage the voltage signal inverse to the voltage signal outputted to the shift register at the next stage.

The duration for the startup voltage in CLK1, CLK2 and CLK3 of the present embodiment is not limited to ⅓ of one cycle, but can be adjusted according to the requirement as long as the startup voltage in CLK1, CLK2 and CLK3 appears one by one, that is, when the startup voltage of CLK1 is off, the startup voltage of CLK2 is on; when the startup voltage of CLK2 is off, the startup voltage of CLK3 is on; and when the startup voltage of CLK3 is off, the startup voltage of CLK1 is on.

Embodiment 3

Figure 4:
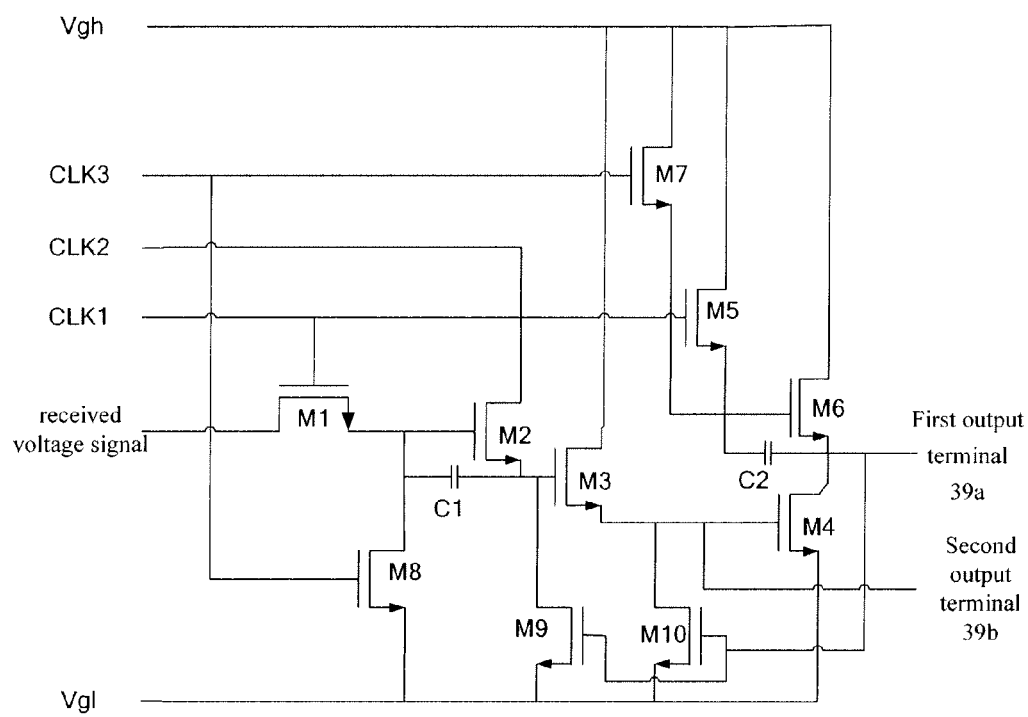
FIG. 4 is a schematic structure diagram of a circuit adopting N channel type TFTs according to embodiment 3 of the present disclosure.

The switching units and control units in the present embodiment can be any combination of Field Effect Transistor, Triode and Thin Film Transistor (TFT). N-channel TFT is used as the device in the switching units and control units in the present embodiment with a circuit structure as shown in FIG. 3 and FIG. 4.

Respective devices in the shift register according to the present embodiment are controlled to be turned on or off by three clock signals, a high voltage source and a low high source. Since N channel TFTs are adopted in the present embodiment, the startup voltage source in the present embodiment is at a high voltage, and the inverse voltage source in the present embodiment is at a low voltage. In the present embodiment, the three clock signals include: CLK1, CLK2 and CLK3. In each cycle of CLK1, there is a voltage shifting module startup voltage with length of ⅓ cycle; in each cycle of CLK2, there is also a voltage shifting module startup voltage with length of ⅓ cycle, which lags behind the startup voltage of CLK1 ⅓ cycle; in each cycle of CLK3, there is also a voltage shifting module startup voltage with length of ⅓ cycle, which lags behind the startup voltage of CLK2 ⅓ cycle. Meanwhile, the high voltage source Vgh and the low voltage source Vgl provide the voltage non-inverted to the startup voltage and the voltage inverse to the startup voltage, respectively.

In the present embodiment, the first switching unit 36a includes a TFT M1 having a gate for receiving CLK1, a drain for receiving a voltage non-inverted to the startup voltage, and a source connected to a gate of TFT M2. M1 performs switching operation under the control of CLK1, controls to output a received voltage to the first capacitor C1 (37a) as a charging voltage and controls M2 to be turned on.

The second switching unit 36b includes the TFT M2 having the gate connected to the source of M1, a drain for receiving CLK2, and a source connected to a gate of TFT M3. M2 is turned on or off under the control of the control voltage outputted from M1, the driving control voltage provided from the first capacitor C1 or the control voltage outputted from TFT M8, so as to control to output CLK2 to TFT M3 as a control voltage.

The first capacitor C1 (37a) receives the startup voltage signal when M1 is turned on, and is charged to provide the driving control voltage to M2.

One terminal of the first capacitor C1 is connected to the gate of M2, and the other terminal of the first capacitor C1 is connected to the source of M2.

The third switching unit 36c includes the TFT M3 having the gate connected to the source of M2, a drain for receiving Vgh, and a source connected to a gate of TFT M4 and to the second output terminal 39b. M3 performs switching operation under the control of the control voltage outputted from M2 or the control voltage outputted from TFT M9, so as to control to output Vgh to TFT M4 as a control voltage and control to output Vgh to second output terminal 39b.

The fourth switching unit 36d includes the TFT M4 having the gate connected to the source of M3, a drain connected to the first output terminal 39a, and a source for receiving Vgl. M4 performs switching operation under the control of the control voltage outputted from the source of M3, so as to output Vgl from the first output terminal 39a which can be used as the output terminal of the shift register at the present stage. A drain of TFT M10 is connected to the gate of M4.

M1-M4 are turned on one by one, such that the received high voltage is delayed and outputted to the shift register at the next stage.

The fifth switching unit 36e includes a TFT M5 having a gate connected to CLK1, a drain for receiving Vgh, and a source connected to a gate of TFT M6. M5 performs switching operation under the control of CLK1, and controls to output Vgh to the second capacitor C2 as a charging voltage and to TFT M6 as a control voltage.

The second capacitor C2 (37b) receives Vgl when M4 is turned on, and turns off M6.

One terminal of the second capacitor C2 is connected to a gate of M6, and another terminal of the second capacitor C2 is connected to a source of M6.

The sixth switching unit 36f includes the TFT M6 having the gate connected to the source of TFT M5, a drain for receiving Vgh, and the source connected to the first output terminal 39a. M6 performs switching operation under the control of the control voltages outputted from M5 and TFT M7, so as to control to output Vgh from the first output terminal 39a.

The seventh switching unit 36g includes the TFT M7 having a gate for receiving CLK3, a drain for receiving Vgh and a source connected to the gate of M6. M7 performs switching operation under the control of CLK3, so as to control to output Vgh to M6 as a control voltage.

The first control unit 38a includes a TFT M8 having a gate for receiving CLK3, a drain connected to the gate of M2 and a source for receiving Vgl. M8 performs switching operation under the control of CLK3, so as to control the first capacitor C1 to be discharged after being connected to Vgl.

The second control unit 38b includes the TFT M9 having a gate connected to the first output terminal 39a, a drain connected to the gate of M3 and a source for receiving Vgl. M9 performs switching operation under the control of the voltage outputted from the first output terminal 39a, so as to control to output Vgl to M3 as a turn-off voltage.

The third control unit 38c includes the TFT M10 having a gate connected to the first output terminal 39a, a drain connected to the source of M3 and a source for receiving Vgl. M10 performs switching operation under the control of the voltage outputted from the first output terminal 39a, so as to control to output Vgl to M4 as a turn-off voltage and to output Vgl from the second output terminal 39b.

M5 to M7 provide the high voltage to the first output terminal 39a to control M9 and M10 to be turned on, so as to control the outputs of M3, M4 and the second output terminal 39b after M9 and M10 being turned on.

After M8 is turned on, the first capacitor C1 is discharged and M2 is turned off.

The second output terminal 39b outputs a voltage signal obtained by delaying the received voltage signal, which can be used, in a driving circuit constituted by a plurality of shift registers, as a signal inputted to the shift register at a next stage. The first output terminal 39a outputs a voltage signal inverse to the voltage signal outputted from the second output terminal 39b, which is supplied to a circuit which needs to be driven by an inverse voltage signal simultaneously.

Figure 5:
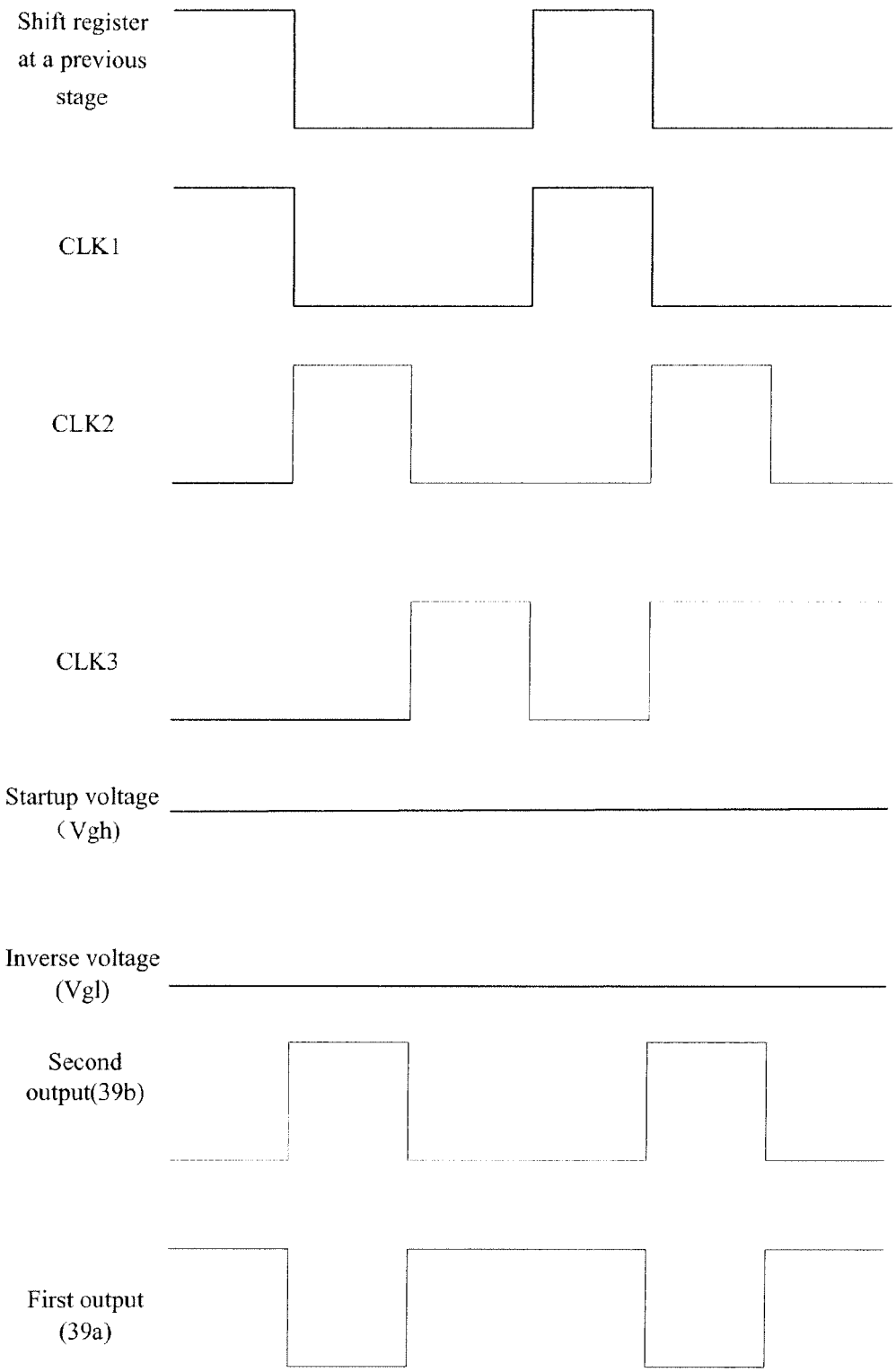
FIG. 5 is a timing sequence diagram of the circuit adopting N channel type TFTs according to embodiment 3 of the present disclosure.

Operational flowchart of the present embodiment is as follows, the timing sequence chart of the present embodiment is as shown in FIG. 5. CLK1, CLK2, CLK3, a startup voltage Vgh and an inverse voltage Vgl are input signals, a first output 39a and a second output 39b are voltage signals outputted from the two output terminals of the shift register.

M1 is turned on under the control of high voltage signal of CLK1, outputs the received high voltage to M2, and charges the first capacitor C1. M5 is turned on under the control of the high voltage signal of CLK1, outputs the high voltage to M6, and charges the second capacitor C2. M6 is turned on under the control of the high voltage signal of CLK1, outputs the high voltage from the first output terminal 39a. M9 and M10 are turned on under the control of the high voltage outputted from the first output terminal 39a, and output the low voltage to M3 and M4 to turn off M3 and M4. The low voltage is outputted from the second output terminal 39b through the turned-on M10.

CLK2 outputs the high voltage and meanwhile CLK1 decreases to a low voltage. M2 is turned on under the control of the charged voltage across the first capacitor C1, and the high voltage of CLK2 is outputted to M3 through M2. After M3 is turned on, the high voltage is outputted to the second output terminal 39b and M4. M4 is turned on under the control of the high voltage, and the low voltage is outputted from the first output terminal 39a through M4. When CLK2 acts as the startup voltage, the voltage at the output terminal of M6 is Vgl, the difference between the voltage at the control terminal and the voltage at the output terminal of M6 causes M6 to be turned on, such that the high voltage is also outputted from the first output terminal 39a after M6 being turned on, at this time, the first output terminal 39a is in a confusion state. Therefore, by adding a second capacitor C2, when CLK2 becomes the startup voltage, the voltage of the control terminal of M6 is changed from the high voltage to the low voltage through the bootstrapping function of the second capacitor C2, such that M6 is in the turned-off state until a next high voltage signal is received. M9 and M10 are turned off under the control of the low voltage outputted from the first output terminal 39a.

CLK3 outputs the high voltage and meanwhile CLK2 decreases to the low voltage. M7 is turned on under the control of CLK3, and outputs the high voltage to M6. The high voltage is outputted from the first output terminal 39a after M6 being turned on. M9 and M10 are turned on under the control of the high voltage outputted from the first output terminal 39a, and output the low voltage to M3, the second output terminal 39b and M4, such that M3 and M4 are turned off. M8 is turned on under the control of CLK3, and outputs the low voltage to the first capacitor C1 to discharge the same.

The duration for the startup voltage in CLK1, CLK2 and CLK3 of the present embodiment is not limited to ⅓ of one cycle, but can be adjusted according to the requirement as long as the startup voltage in CLK1, CLK2 and CLK3 appears one by one, that is, when the startup voltage of CLK1 is off, the startup voltage of CLK2 is on; when the startup voltage of CLK2 is off, the startup voltage of CLK3 is on; when the startup voltage of CLK3 is off, the startup voltage of CLK1 is on.

Embodiment 4

Figure 6:
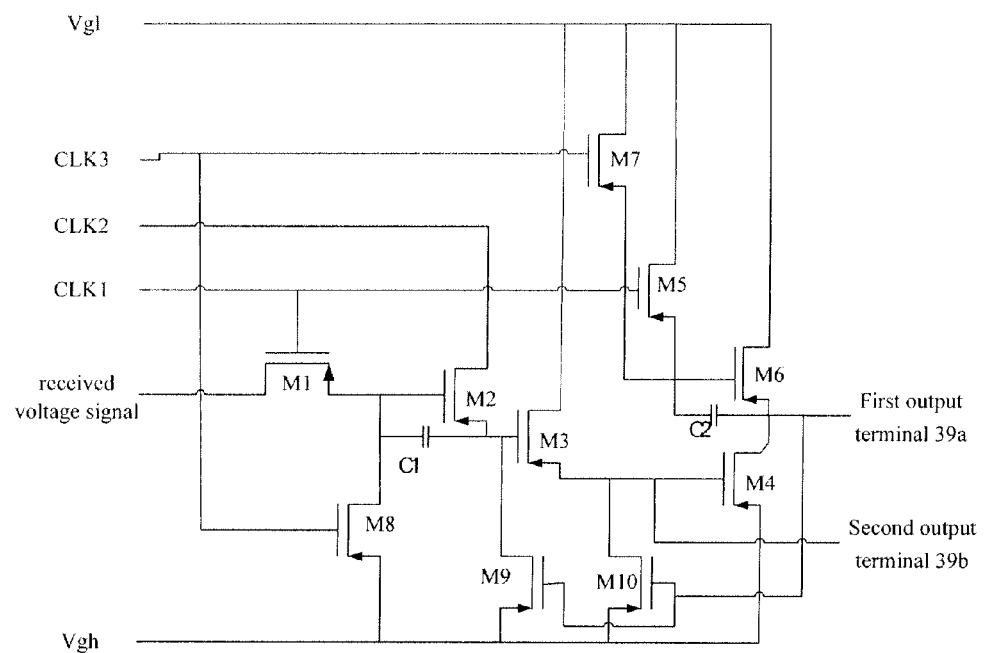
FIG. 6 is a schematic structure diagram of a circuit adopting P channel type TFTs according to embodiment 4 of the present disclosure.

The switching units and control units in the present embodiment can be any combination of Field Effect Transistor, Triode and Thin Film Transistor (TFT). P-channel TFT is used as the device in switching units and control units in the present embodiment with a circuit structure as shown in FIG. 3 and FIG. 6.

Respective devices in the shift register according to the present embodiment are controlled to be turned on or off by three clock signals, a high voltage source and a low high source. Since P channel TFTs are adopted in the present embodiment, the startup voltage source in the present embodiment is at a low level, and the inverse voltage source in the present embodiment is at a high level. In the present embodiment, the three clock signals include: CLK1, CLK2 and CLK3. In each cycle of CLK1, there is a voltage shifting module startup voltage with length of ⅓ cycle; in each cycle of CLK2, there is also a voltage shifting module startup voltage with length of ⅓ cycle, which lags behind the startup voltage of CLK1 ⅓ cycle; in each cycle of CLK3, there is also a voltage shifting module startup voltage with length of ⅓ cycle, which lags behind the startup voltage of CLK2 ⅓ cycle. Meanwhile, the high voltage source Vgh and the low voltage source Vgl provide the voltage inverse to the startup voltage and the voltage non-inverted to the startup voltage, respectively.

In the present embodiment, the shift register includes:

a first switching unit 36a including a TFT M1 having a gate for receiving CLK1, a drain for receiving the voltage (Vgl, in the present embodiment) non-inverted to the startup voltage, and a source connected to a gate of TFT M2, wherein M1 performs switching operation under the control of CLK1, controls to output a received voltage to a first capacitor C1 as a charging voltage and controls M2 to be turned on;

a second switching unit 36b including the TFT M2 having the gate connected to the source of M1, a drain for receiving CLK2, and a source connected to a gate of TFT M3, wherein M2 is turned on or off under the control of a control voltage outputted from M1, a driving control voltage provided from the first capacitor C1 or a control voltage outputted from TFT M8, so as to control to output CLK2 to TFT M3 as a control voltage;

the first capacitor C1 (C37a) for receiving the startup signal when M1 is turned on, and being charged to provide the driving control voltage to M2, wherein one terminal of the first capacitor C1 is connected to the gate of M2, and the other terminal of the first capacitor C1 is connected to the source of M2;

a third switching unit 36c including the TFT M3 having a gate connected to the source of M2, a drain for receiving Vgl, and a source connected to a gate of TFT M4 and to the second output terminal 39b, wherein M3 performs switching operation under the control of the control voltage outputted from M2 or a control voltage outputted from TFT M9, so as to output Vgl to TFT M4 to control M4 and to output Vgh to the second output terminal 39b, and wherein a drain of TFT M9 is connected to the gate of M3;

a fourth switching unit 36d including the TFT M4 having the gate connected to the source of M3, a drain connected to the first output terminal 39a, and a source for receiving Vgh, wherein M4 performs switching operation under the control of a control voltage outputted from the source of M3, so as to output Vgh from the first output terminal 39a, and wherein a drain of TFT M10 is connected to the gate of M4;

wherein M1-M4 are turned on one by one, such that the received low voltage of startup voltage is delayed and outputted to the shift register at a next stage;

a fifth switching unit 36e including a TFT M5 having a gate for receiving the CLK1, a drain for receiving Vgl, and a source connected to a gate of TFT M6, wherein M5 performs switching operation under the control of CLK1, and controls to output Vgl to a second capacitor C2 as a charging voltage and to TFT M6 as a control voltage;

the second capacitor C2 (37b) for receiving Vgh when the fourth switching unit 36d is turned on, and turns off TFT M6, wherein one terminal of the second capacitor C2 is connected to a gate of M6, and another terminal of the second capacitor C2 is connected to a source of M6;

a sixth switching unit 36f including the TFT M6 having the gate connected to the source of TFT M5, a drain for receiving Vgl, and the source connected to the first output terminal 39a, wherein M6 performs switching operation under the control of the control voltage outputted from M5 and a control voltages outputted from TFT M7, so as to control to output Vgl from the first output terminal 39a;

a seventh switching unit 36g including the TFT M7 having a gate for receiving CLK3, a drain for receiving Vgl and a source connected to the gate of M6, wherein M7 performs switching operation under the control of CLK3, so as to control to output Vgl to M6 as the control voltage;

a first control unit 38a including a TFT M8 having a gate for receiving CLK3, a drain connected to the gate of M2 and a source for receiving Vgh, wherein M8 performs switching operation under the control of CLK3, so as to control the first capacitor 37a to be discharged after being connected to Vgh;

a second control unit 38*b* including the TFT M9 having a gate connected to the first output terminal 39*a*, a drain connected to the gate of M3 and a source for receiving Vgh, wherein M9 performs switching operation under the control of the voltage outputted from the first output terminal 39*a*, so as to control to output Vgh to M3 as a turn-off voltage;

a third control unit 38*c* includes the TFT M10 having a gate connected to the first output terminal 39*a*, a drain connected to the source of M13 and a source for receiving Vgh, wherein M10 performs switching operation under the control of the voltage outputted from the first output terminal 39*a*, so as to control to output Vgh to M4 as a turn-off voltage and to output Vgh from the second output terminal 39*b*;

wherein M5 to M7 provide the low voltage to the first output terminal 39*a* to control M9 and M10 to be turned on, so as to control M3 and M4 to be turned off and output Vgh from the second output terminal 39*b*;

wherein after M8 is turned on, the first capacitor C1 is discharged and M2 is turned off.

The second output terminal 39*b* outputs a voltage signal obtained by delaying the received voltage signal, which can be used, in a driving circuit constituted by a plurality of shift registers, as a signal inputted to the shift register at a next stage. The first output terminal 39*a* outputs a voltage signal inverse to the voltage signal outputted from the second output terminal 39*b*, which is supplied to a circuit which needs to be driven by an inverse voltage signal simultaneously.

Figure 7:
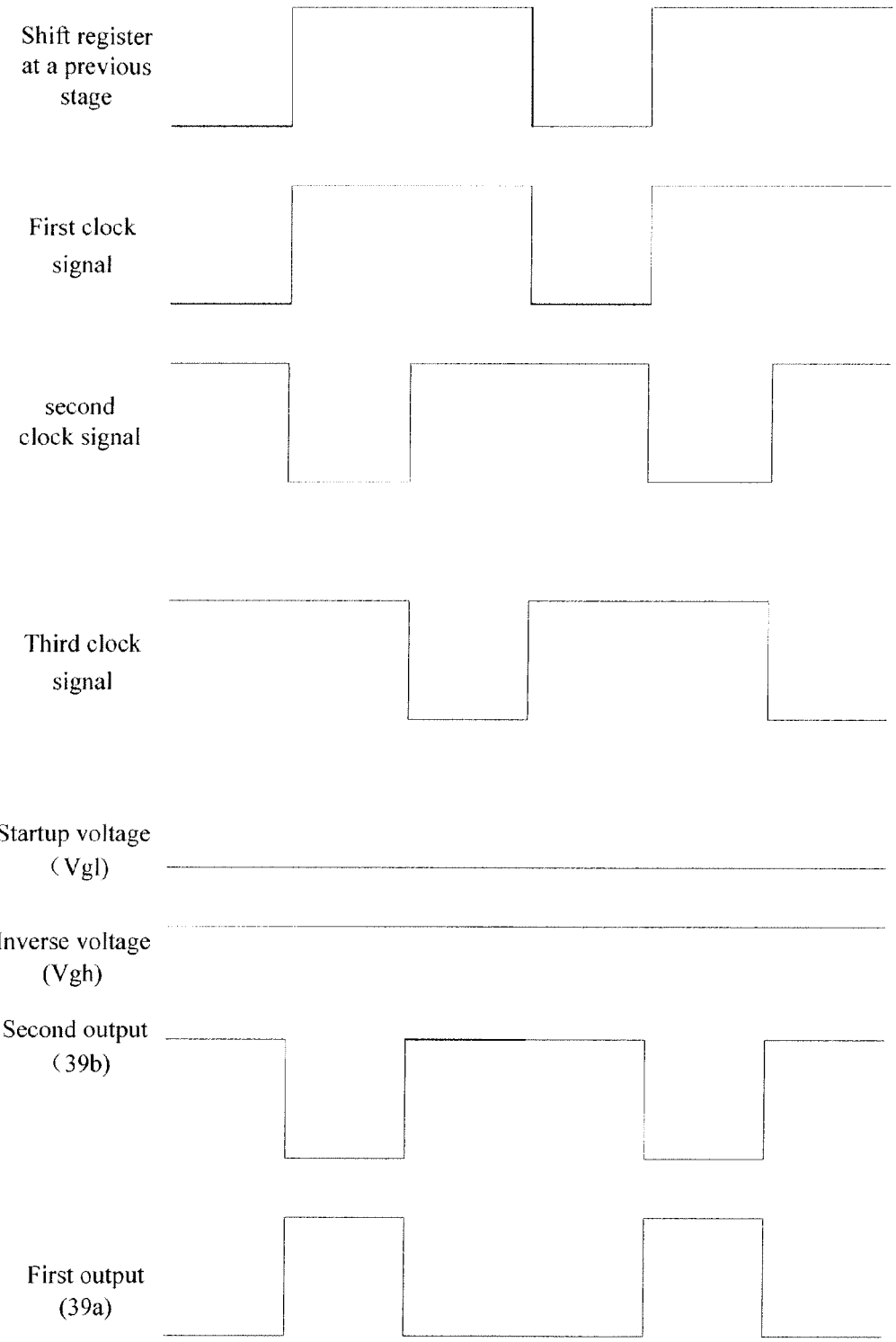
FIG. 7 is a timing sequence diagram of the circuit adopting P channel type TFTs according to embodiment 4 of the present disclosure.

Operational flowchart of the present embodiment is as follows, the timing sequence chart of the present embodiments is as shown in FIG. 7. CLK1, CLK2, CLK3, an inverse voltage Vgh and a startup voltage Vgl are input signals, a first output 39*a* and a second output 39*b* are voltage signals outputted from the two output terminals of the shift register.

M1 is turned on under the control of low voltage signal of CLK1, outputs the received voltage non-inverted to the startup voltage to M2, and charges the first capacitor C1. M5 is turned on under the control of the low voltage signal of CLK1, outputs a low voltage to M6, and charges the second capacitor C2. M6 is turned on under the control of the low voltage signal of CLK1, outputs a low voltage from the first output terminal 39*a*. M9 and M10 are turned on under the control of the low voltage outputted from the first output terminal 39*a*, and output the high voltage to M3 and M4 to turn off M3 and M4. The high voltage is outputted from the second output terminal 39*b* through the turned-on M10.

CLK2 outputs a low voltage and meanwhile CLK1 increases to a high voltage. The voltage accumulated across the first capacitor C1, when CLK1 outputs the low voltage, is provided to M2 when CLK2 outputs the low voltage. M2 is turned on under the control of the charged voltage across the first capacitor C1, and the low voltage of CLK2 is outputted to M3 through M2. After M3 is turned on, the low voltage is outputted to the second output terminal 39*b* and M4. M4 is turned on under the control of the low voltage, and the high voltage is outputted from the first output terminal 39*a* through M4. When CLK2 is at the low voltage, the voltage at the output terminal of M6 is Vgh, since the control terminal of M6 is in floating, the difference between the voltage at the control terminal and the voltage at the output terminal of M6 causes M6 to be turned on, such that the low voltage is also outputted from the first output terminal 39*a*, at this time, the first output terminal 39*a* is in a confusion state. Therefore, by adding a second capacitor C2, the voltage of the control terminal of M6 is changed from the low voltage to the high voltage through the bootstrapping function of the second capacitor C2, such that M6 is in the turned-off state until a next low voltage signal is received. M9 and M10 are turned off under the control of the high voltage outputted from the first output terminal 39*a*.

CLK3 outputs a low voltage and meanwhile CLK2 increases to a high voltage. M7 is turned on under the control of CLK3, and outputs the low voltage to M6. The low voltage is outputted from the first output terminal 39*a* after M6 is turned on. M9 and M10 are turned on under the control of the low voltage outputted from the first output terminal 39*a*, and output the high voltage to M3, the second output terminal 39*b* and M4, such that M3 and M4 are turned off. M8 is turned on under the control of CLK3, and outputs the high voltage to the first capacitor C1 to discharge the same.

The duration for the startup voltage in CLK1, CLK2 and CLK3 of the present embodiment is not limited to ⅓ of one cycle, but can be adjusted according to the requirement as long as the startup voltage in CLK1, CLK2 and CLK3 appears one by one, that is, when the startup voltage of CLK1 is off, the startup voltage of CLK2 is on; when the startup voltage of CLK2 is off, the startup voltage of CLK3 is on; and when the startup voltage of CLK3 is off, the startup voltage of CLK1 is on.

The present disclosure further provides a driving circuit constituted by combining a plurality of shift registers together. Description will be given to the driving circuit according to the present disclosure in conjunction with the accompanying drawings.

Figure 8:
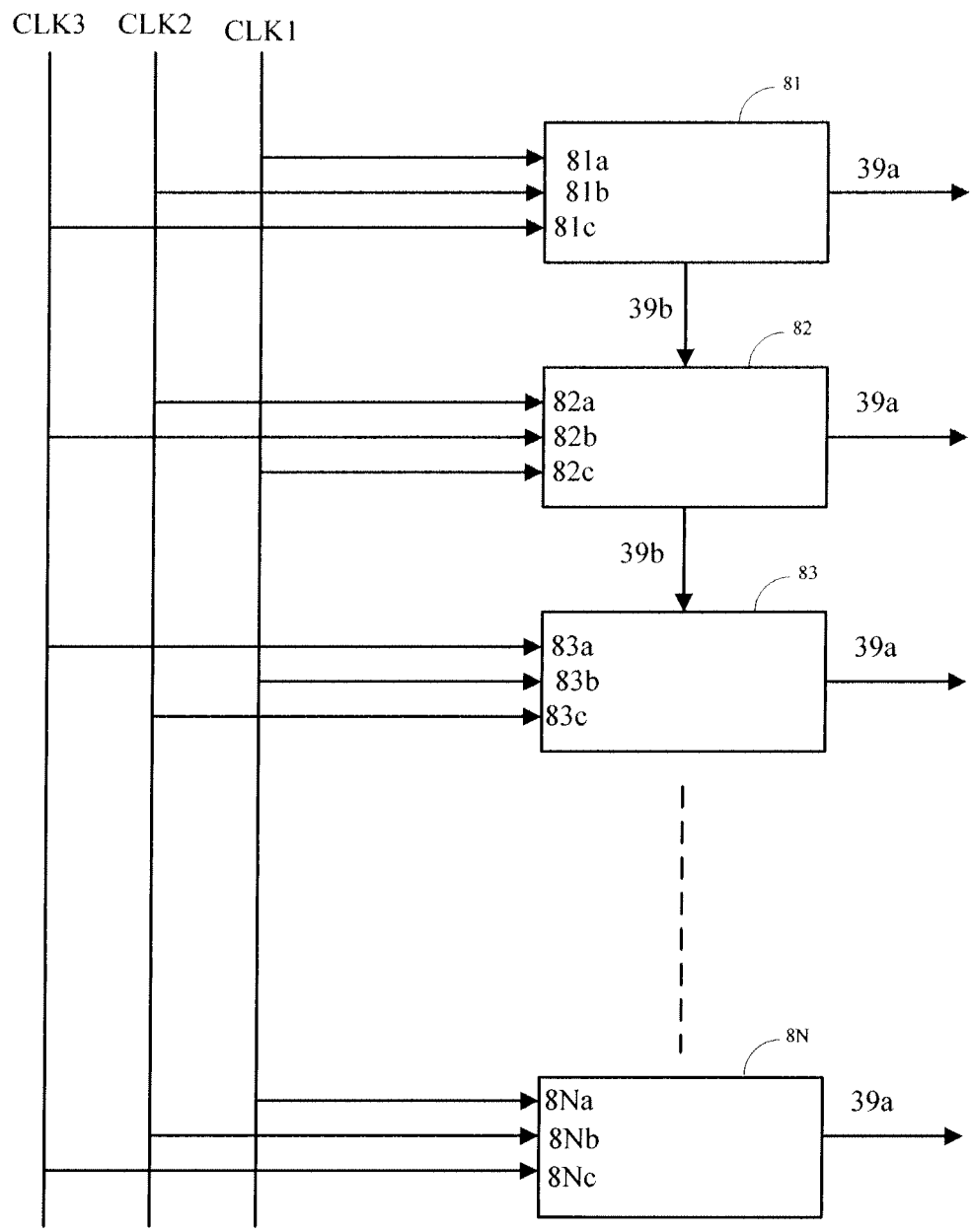
FIG. 8 is a schematic structure diagram of a driving circuit constituted by a plurality of shift registers according to the embodiments of the present disclosure.

As shown in FIG. 8, the driving circuit is constituted by the shift register 81 at a first stage, the shift register 8N at a last stage and at least one shift register 82~8N–1 at intermediate stages. Each of the shift registers adopts the shift register described in the above embodiments, and respective shift registers are connected in cascade. Each of the shift registers has a first output terminal and a second output terminal, a voltage signal outputted from the first output terminal is the voltage signal obtained by shifting a received voltage signal, and a voltage signal outputted from the second output terminal is inverse to the voltage signal outputted from the first output terminal. A voltage shifting module of shift register at each stage receives a voltage non-inverted to the startup voltage.

The shift register 81 at the first stage is used for receiving the voltage non-inverted to the startup voltage which is triggered from the external, outputs a voltage from the second output terminal 39*b* to the voltage shifting module of the shift register at a next stage, and outputs from the first output terminal 39*a* a voltage inverse to the voltage outputted from the second output terminal 39*b*.

Each of the shift registers 82~8N–1 at intermediate stages is used for receiving the voltage outputted from the second output terminal 39*b* of the shift register at a previous stage, outputs a voltage from the second output terminal 39*b* to the voltage shifting module of the shift register at a next stage, and outputs from the first output terminal 39*a* a voltage inverse to the voltage outputted from the second output terminal 39*b*.

The shift register 8N at the last stage is used for receiving the voltage outputted from the second output terminal 39*b* of the shift register at a previous stage, and outputs from the first output terminal 39*a* a voltage inverse to the voltage outputted from the second output terminal 39*b*.

The voltage outputted from the second output terminal of the shift register at the present stage is inputted to the voltage shifting module of the shift register at a next stage. Moreover, after the first startup voltage signal for controlling the shift register at the present stage is off, the first startup voltage signal for controlling the shift register at a next stage is on.

In the embodiment as shown in FIG. 8, the shift register 81 is the shift register at the first stage in the driving circuit. The shift register 82 is the shift register at a stage next to the shift register 81, the shift register 83 is the shift register at a stage next to the shift register 82, and so on. Finally, the shift register 8N is the shift register at the last stage. Each of the shift register is controlled by CLK1, CLK2 and CLK3, wherein a startup voltage firstly appears in CLK1; when the startup voltage of CLK1 is off, a startup voltage appears in CLK2; when the startup voltage of CLK2 is off, a startup voltage appears in CLK3; when the startup voltage of CLK3 is off, a startup voltage appears in CLK1.

The first startup voltage signal 81a of the shift register 81 comes from CLK1, the second startup voltage signal 81b of the shift register 81 comes from CLK2, and the third startup voltage signal 81c of the shift register 81 comes from CLK3. For the shift register 82 as a stage next to the shift register 81, the first startup voltage signal 82a of the shift register 82 comes from CLK2, the second startup voltage signal 82b of the shift register 82 comes from CLK3, the third startup voltage signal 82c of the shift register 82 comes from CLK1, and so on. As such, after the first startup voltage signal for controlling the shift register at the present stage is off the first startup voltage signal for controlling the shift register at a next stage is on. That is, the first clock signal of the shift register at the next stage lags behind the first clock signal of the shift register at the present stage by ⅓ of clock cycle. Although the startup voltage signals in the three clock signals have the same duration in the present embodiment, there is no such limitation in an actual application, as long as the previous startup signal is off and the subsequent startup up signal is on, the startup signals in the three clock signals is on one by one in a loop.

In the driving circuit according to the present embodiment, the signal received by the shift register at the first stage is triggered from the external, the signals received by the shift registers at the intermediate stages and at the last stage come from the voltage outputted from the second output terminal of the shift register at a previous stage connected thereto. Meanwhile, each of the shift registers outputs, as the output of the present stage, from the first output terminal a voltage inverse to the voltage outputted from the second output terminal.

The driving circuit according to the present embodiment is constituted by a plurality of shift registers according to the above embodiments of the present disclosure. Each of the shift registers delays and outputs the startup voltage received therein, and also outputs a voltage inverse to the outputted delayed voltage. As such, for a case that a positive voltage and a negative voltage are required in a pixel circuit simultaneously, it can be meet by voltages provided in the driving circuit according to the present embodiment.

Furthermore, there is also provided a display apparatus in the present disclosure. In the display apparatus according the embodiment of the present disclosure, there is equipped the above described driving circuit which includes at least two shift registers connected in cascade.

Figure 9:
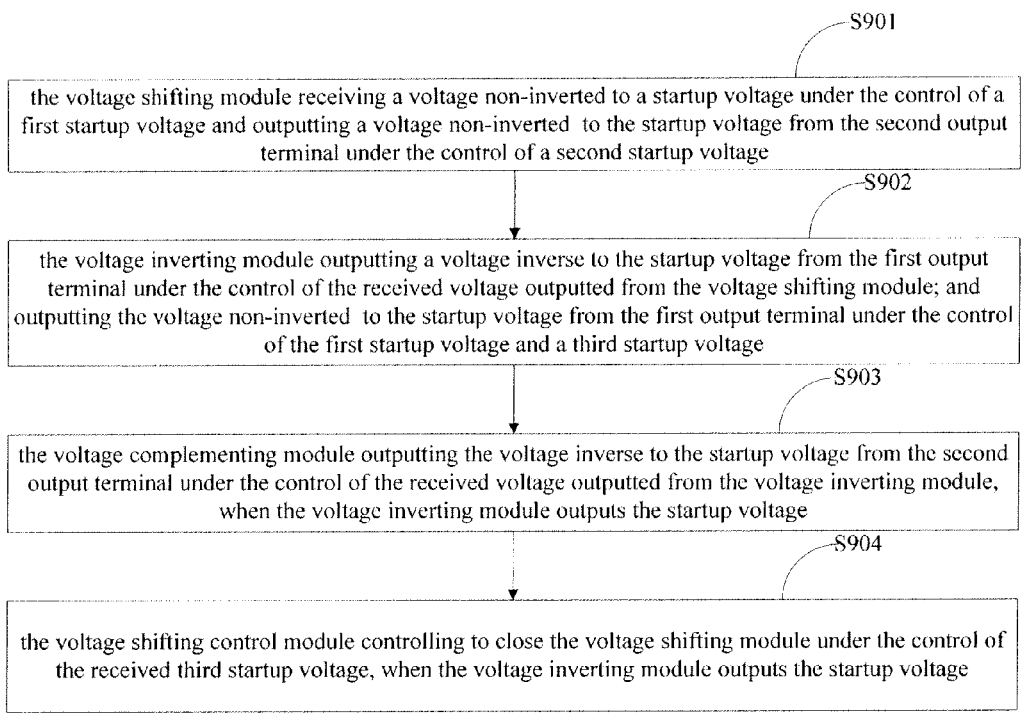
FIG. 9 is a flowchart of a method according to the embodiments of the present disclosure.

In the present disclosure, there is further provided a shifting method for a shift register with an inverse output. Descriptions will be given to the shifting method according the present embodiment of the present disclosure in conjunction with FIG. 9.

In step S901, the voltage shifting module receives a voltage non-inverted to a startup voltage under the control of a first startup voltage, and outputs from the second output terminal a voltage non-inverted to the startup voltage under the control of a second startup voltage.

In step S902, the voltage inverting module outputs a voltage inverse to the startup voltage from the first output terminal under the control of the received voltage outputted from the voltage shifting module, and outputs the voltage non-inverted to the startup voltage from the first output terminal under the control of the first startup voltage and a third startup voltage.

In step S903, the voltage complementing module outputs a voltage inverse to the startup voltage from the second output terminal under the control of the received voltage outputted from the voltage inverting module, when the voltage inverting module outputs the startup voltage.

In step S904, the voltage shifting control module controls to turn off the voltage shifting module under the control of the received third startup voltage when the voltage inverting module outputs the startup voltage.

Wherein the first startup voltage signal, the second startup voltage and the third startup voltage appear one by one in a loop.

It will be obvious that those skilled in the art may make modifications and variations to the above embodiments without departing the spirit and scope of the present disclosure as defined by the following claims. Such variations and modifications are intended to be included within the spirit and scope of the present disclosure.

What is claimed is:

1. A shift register including:
a voltage shifting module, a voltage inverting module, a voltage complementing module, a voltage shifting control module, a first output terminal and a second output terminal;
wherein the voltage shifting module is used for receiving a voltage non-inverted to a startup voltage under the control of a first startup voltage signal and outputting the received voltage non-inverted to the startup voltage from the second output terminal and simultaneously to the voltage inverting module under the control of a second startup voltage signal;
the voltage inverting module is connected to the voltage shifting module and is used for outputting a voltage inverse to the startup voltage from the first output terminal and simultaneously to the voltage complementing module under the control of the received voltage outputted from the voltage shifting module and a voltage supplied from an inverse voltage source; and outputting the voltage non-inverted to the startup voltage from the first output terminal and simultaneously to the voltage complementing module under the control of the first startup voltage signal and a voltage supplied from a startup voltage source or under the control of a third startup voltage signal and the voltage supplied from the startup voltage source;
the voltage complementing module is connected to the voltage inverting module and the voltage shifting module, and is used for outputting the voltage inverse to the startup voltage from the second output terminal and simultaneously to the voltage inverting module under the control of the received voltage outputted from the voltage inverting module and the voltage supplied from the inverse voltage source, when the voltage inverting module outputs the voltage non-inverted to the startup voltage; and
the voltage shifting control module is connected to the voltage shifting module, and is used for controlling to turn off the voltage shifting module under the control of the third startup voltage signal and the voltage supplied from the inverse voltage source.

2. The shift register of claim 1, wherein the first startup voltage signal is a first clock signal (CLK1), the second startup voltage signal is a second clock signal (CLK2), and the third startup voltage signal is a third clock signal (CLK3).

3. The shift register of claim 1,
wherein the voltage shifting module includes:
a first switching unit for performing switching operation under the control of the first startup voltage signal (CLK1), and controls to output the received voltage non-inverted to the startup voltage to a first capacitor as a charging voltage and to a second switching unit as a control voltage;
the first capacitor for receiving the voltage non-inverted to the startup voltage when the first switching unit is turned on and being charged to provide a driving control voltage to the second switching unit; and
the second switching unit for performing switching operation so as to output the startup voltage from the second output terminal under the control of the startup voltage outputted from the first switching unit, the driving control voltage provided by the first capacitor or an inverse voltage outputted from a first control unit;
wherein the voltage inverting module includes:
a fourth switching unit for performing switching operation under the control of the startup voltage outputted from a third switching unit, so as to output the voltage supplied from the inverse voltage source from the first output terminal;
the fifth switching unit for performing switching operation under the control of the first startup voltage signal (CLK1), and outputs the voltage supplied from the startup voltage source to a second capacitor as a charging voltage and to a sixth switching unit as a control voltage;
the second capacitor for receiving the voltage supplied from the inverse voltage source when the fourth switching unit is turned on so as to turn off the sixth switching unit;
the sixth switching unit for performing switching operation under the control of the control voltage outputted from the fifth switching unit and a control voltage outputted from a seventh switching unit or under the control of the second capacitor, so as to control to output the voltage supplied from the startup voltage source from the first output terminal; and
the seventh switching unit for performing switching operation under the control of the third startup voltage signal (CLK3), so as to control to output the voltage supplied from the startup voltage source to the sixth switching unit as the control voltage;
wherein the voltage complementing module includes: a third control unit for performing switching operation under the control of the voltage outputted from the first output terminal, so as to control to output the voltage supplied from the inverse voltage source to the fourth switching unit as a turn-off voltage and output the voltage supplied from the inverse voltage source from the second output terminal;
the voltage shifting control module includes: the first control unit for performing switching operation under the control of the third startup voltage signal (CLK3), so as to control the first capacitor to be discharged after being connected to the inverse voltage source and control to output the voltage supplied from the inverse voltage source to the second switching unit as the control voltage;

wherein the inverse voltage source is used for outputting the voltage inverse to the voltage for starting up the voltage shifting module; and
the startup voltage source is used for outputting the voltage non-inverted to the voltage for starting up the voltage shifting module.

4. The shift register of claim 3, further including:
a voltage stabilizing module connected to the voltage shifting module and the voltage inverting module, for stabilizing and outputting from the second output terminal a received voltage outputted from the voltage shifting module and outputting the same to the voltage inverting module, under the control of the voltage supplied from the startup voltage source; and
a voltage stabilizing control module connected to the voltage inverting module and the voltage stabilizing module, for closing the voltage stabilizing module under the control of the received voltage outputted from the first output terminal by the voltage inverting module and the voltage supplied from the inverse voltage source, when the voltage inverting module outputs the voltage non-inverted to the startup voltage.

5. The shift register of claim 4,
wherein the voltage stabilizing module includes the third switching unit for performing switching operation under the control of a control voltage outputted from the second switching unit or a control voltage outputted from a second control unit so as to control to output the voltage outputted from the startup voltage source to the fourth switching unit as a control voltage and control to output the voltage outputted from the startup voltage source from the second output terminal;
wherein the voltage stabilizing control module includes the second control unit for performing switching operation under the control of the voltage outputted from the first output terminal so as to control to output the voltage outputted from the inverse voltage source to the third switching unit as a turn-off voltage.

6. The shift register of claim 5, wherein when the first to seventh switching units and the first to third control units are N type Field Effect Transistors, the startup voltage source is a high voltage source (Vgh), and the inverse voltage source is a low voltage source (Vgl);
the first switching unit includes a first Thin Film Transistor (TFT) (M1) having a gate for receiving the first startup voltage signal (CLK1), a drain for receiving the voltage non-inverted to the startup voltage, and a source connected to a gate of a second TFT (M2) and one terminal of the first capacitor;
the second switching unit includes the second TFT (M2) having the gate connected to the source of the first TFT (M1), a drain for receiving the second startup voltage signal (CLK2), and a source connected to a gate of a third TFT (M3);
the one terminal of the first capacitor is connected to the gate of the second TFT (M2), and the other terminal of the first capacitor is connected to the source of the second TFT (M2);
the third switching unit includes the third TFT (M3) having the gate connected to the source of the second TFT (M2), a drain for receiving the high voltage source (Vgh), and a source connected to a gate of a fourth TFT (M4) and to the second output terminal;
the fourth switching unit includes the fourth TFT (M4) having the gate connected to the source of the third TFT (M3), a drain connected to the first output terminal, and a source for receiving the low voltage source (Vgl);

the fifth switching unit includes a fifth TFT (M5) having a gate for receiving the first startup voltage signal (CLK1), a drain for receiving the high voltage source (Vgh), and a source connected to a gate of a sixth TFT (M6);

one terminal of the second capacitor is connected to the gate of the sixth TFT (M6), and another terminal of the second capacitor is connected to a source of the sixth TFT (M6);

the sixth switching unit includes the sixth TFT (M6) having the gate connected to the source of the fifth TFT (M5) and a source of a seventh TFT (M7), a drain for receiving the high voltage source (Vgh), and the source connected to the drain of the fourth TFT (M4) and to the first output terminal;

the seventh switching unit includes the seventh TFT (M7) having a gate for receiving the third startup voltage signal (CLK3), a drain for receiving the high voltage source (Vgh) and a source connected to the gate of the sixth TFT (M6);

the first control unit includes an eighth TFT (M8) having a gate for receiving the third startup voltage signal (CLK3), a drain connected to the gate of the second TFT (M2) and a source for receiving the low voltage source (Vgl);

the second control unit includes a ninth TFT (M9) having a gate connected to the drain of the fourth TFT (M4), a drain connected to the gate of the third TFT (M3) and a source for receiving the low voltage source (Vgl);

the third control unit includes a tenth TFT (M10) having a gate connected to the drain of the fourth TFT (M4), a drain connected to the source of the third TFT (M3) and a source for receiving the low voltage source (Vgl).

7. The shift register of claim 5, wherein when the first to seventh switching units and the first to third control units are P type Field Effect Transistors, the inverse voltage source is a high voltage source (Vgh), and the startup voltage source is a low voltage source (Vgl);

the first switching unit includes a first Thin Film Transistor (TFT) (M1) having a gate for receiving the first startup voltage signal (CLK1), a drain for receiving the voltage non-inverted to the startup voltage, and a source connected to a gate of a second TFT (M2);

the second switching unit includes the second TFT (M2) having the gate connected to the source of the first TFT (M1), a drain for receiving the second startup voltage signal (CLK2), and a source connected to a gate of a third TFT (M3);

one terminal of the first capacitor is connected to the gate of the second TFT (M2), and the other terminal of the first capacitor is connected to the source of the second TFT (M2);

the third switching unit includes the third TFT (M3) having the gate connected to the source of the second TFT (M2), a drain for receiving the low voltage source (Vgl), and a source connected to a gate of a fourth TFT (M4) and to the second output terminal;

the fourth switching unit includes the fourth TFT (M4) having the gate connected to the source of the third TFT (M3), a drain connected to the first output terminal, and a source for receiving the high voltage source (Vgh);

the fifth switching unit includes a fifth TFT (M5) having a gate for receiving the first startup voltage signal (CLK1), a drain for receiving the low voltage source (Vgl), and a source connected to a gate of a sixth TFT (M6);

one terminal of the second capacitor is connected to the gate of the sixth TFT (M6), and another terminal of the second capacitor is connected to a source of the sixth TFT (M6);

the sixth switching unit includes the sixth TFT (M6) having the gate connected to the source of the fifth TFT (M5), a drain for receiving the low voltage source (Vgl), and the source connected to the first output terminal;

the seventh switching unit includes the seventh TFT (M7) having a gate for receiving the third startup voltage signal (CLK3), a drain for receiving the low voltage source (Vgl) and a source connected to the gate of the sixth TFT (M6);

the first control unit includes an eighth TFT (M8) having a gate for receiving the third startup voltage signal (CLK3), a drain connected to the gate of the second TFT (M2) and a source for receiving the high voltage source (Vgh);

the second control unit includes a ninth TFT (M9) having a gate connected to the drain of the fourth TFT (M4), a drain connected to the gate of the third TFT (M3) and a source for receiving the high voltage source (Vgh);

the third control unit includes a tenth TFT (M10) having a gate connected to the drain of the fourth TFT (M4), a drain connected to the source of the third TFT (M3) and to the second output terminal, and a source for receiving the high voltage source (Vgh).

8. A shifting method of a shift register including a voltage shifting module, a voltage inverting module, a voltage complementing module, a voltage shifting control module, a first output terminal and a second output terminal, and the shifting method including:

the voltage shifting module receiving a voltage non-inverted to a startup voltage under the control of a first startup voltage and outputting a voltage non-inverted to the startup voltage from the second output terminal under the control of a second startup voltage;

the voltage inverting module outputting a voltage inverse to the startup voltage from the first output terminal under the control of the received voltage outputted from the voltage shifting module; and outputting the voltage non-inverted to the startup voltage from the first output terminal under the control of the first startup voltage and a third startup voltage;

the voltage complementing module outputting the voltage inverse to the startup voltage from the second output terminal under the control of the received voltage outputted from the voltage inverting module, when the voltage inverting module outputs the startup voltage; and the voltage shifting control module controlling to turn off the voltage shifting module under the control of the received third startup voltage, when the voltage inverting module outputs the startup voltage.

9. A driving circuit including a shift register at a first stage, a shift register at a last stage and at least one shift register at an intermediate stage wherein each of the shift registers is the shift register of claim 1, and the shift registers are connected in cascade, the second output terminal of the shift register at each stage is connected to the voltage shifting module of the shift register at a next stage; wherein the shift register at the first stage receives an external voltage, outputs a voltage from the second output terminal to the shift register at a next stage, and outputs from the first output terminal a voltage inverse to the voltage outputted from the second output terminal;

each of the shift registers at intermediate stages receives the voltage outputted from the second output terminal of the shift register at a previous stage, outputs a voltage from the second output terminal thereof to the shift register at a next stage, and outputs from the first output terminal thereof a voltage inverse to the voltage outputted from the second output terminal;

the shift register at the last stage receives the voltage outputted from the second output terminal of the shift register at a previous stage, and outputs from the first output terminal a voltage inverse to the voltage outputted from the second output terminal thereof;

wherein after the first startup voltage signal for controlling the shift register at the present stage is off, the first startup voltage signal for controlling the shift register at a next stage is on.

* * * * *